United States Patent [19]
Wong et al.

[11] Patent Number: 5,682,352
[45] Date of Patent: Oct. 28, 1997

[54] DIGITAL TESTING OF ANALOG MEMORY DEVICES

[75] Inventors: Sau C. Wong, Hillsborough; Hock C. So, Redwood City, both of Calif.

[73] Assignee: inVoice Technology, Inc., Sunnyvale, Calif.

[21] Appl. No.: 598,485

[22] Filed: Feb. 8, 1996

[51] Int. Cl.[6] .................................................. G11C 29/00
[52] U.S. Cl. ........................ 365/201; 371/21.2; 371/25.1
[58] Field of Search ........................ 365/201, 185.03, 365/45, 168; 324/765, 769; 371/21.1, 21.2, 25.1

[56] References Cited

U.S. PATENT DOCUMENTS

| | | | |
|---|---|---|---|
| 5,163,021 | 11/1992 | Mehrotra | 365/201 |
| 5,481,551 | 1/1996 | Nakano | 365/201 |
| 5,528,603 | 6/1996 | Canella | 371/21.2 |
| 5,539,699 | 7/1996 | Sato | 365/201 |

*Primary Examiner*—David C. Nelms
*Assistant Examiner*—Son Mai

*Attorney, Agent, or Firm*—Skjerven, Morrill, MacPherson, Franklin & Friel; Alan H. MacPherson; David T. Millers

[57] ABSTRACT

An analog memory has comparison logic and a reference voltage generator built on-chip for testing of analog write and read processes. During a test, the reference voltage generator, which may be a resistor tree structure, provides a set of intermediate voltages. One of the intermediate voltages $V_{IN}$ is written to a selected memory cell. The comparison logic compares other intermediate voltages $V_H$ and $V_L$ to an analog output signal generated by reading the selected memory cell. A digital control signal from an external digital tester selects the levels of voltages $V_{IN}$, $V_H$, and $V_L$. Typically, voltages $V_H$ and $V_L$ are equal $V_{IN} \pm \Delta V$ where $\Delta V$ represents an acceptable resolution for stored analog data. If the signal from reading the selected memory cell falls within a desired range $V_{IN} \pm \Delta V$, an output digital result signal is set; otherwise, the test result signal is cleared. A low-cost digital tester which generates the digital control signals and observes the digital result signal can test all the circuits associated directly with write and read processes. Since the analog signals for the test are generated on-chip, the effect of noise is minimized, and a high accuracy resolution test is achieved.

25 Claims, 5 Drawing Sheets

DIGITAL TESTING OF ANALOG MEMORY DEVICES

BACKGROUND OF THE INVENTION

1. Field of the Invention

This invention relates to analog semiconductor memory and methods for testing analog memory during manufacturing or use.

2. Description of Related Art

Manufacture of analog semiconductor devices has traditionally required special analog test equipment to check analog responses of the devices. In order to test an analog memory, a tester needs to generate a set of analog voltages and control writing of the analog voltages to a set of analog memory cells. The tester subsequently activates a read circuit in the analog memory and checks an analog output signal from the memory to determine whether reading from the analog memory cells generates output signals within an acceptable voltage range of the voltages written. Conventional digital test equipment is unable to generate the analog voltages to be written and is unable to determine whether analog voltages read from an analog memory are within the acceptable range (i.e. resolution) for the analog memory. Accordingly, an analog tester is required.

Such analog testers are typically more expensive than digital testers, and the cost of the analog testers increases the manufacturing costs of analog devices.

SUMMARY OF THE INVENTION

In accordance with the invention, an analog device has a reference voltage generator and comparison logic built on-chip to allow digital testing of analog functions. During testing, the reference voltage generator provides several voltages which are referred to herein as intermediate voltages because not all of the intermediate voltages are equal to a "high" voltage associated with a binary "1" or a "low" voltage associated with a binary "0". The intermediate voltages can be used as analog input signals during testing of the analog device. The comparison logic tests analog output voltages of the analog device and can use intermediate voltages from the reference voltage generator as reference voltages in the comparisons.

One embodiment of the invention is an analog memory integrated circuit which includes a reference voltage generator and comparison logic for testing read and write processes of the analog memory. The reference voltage generator in one embodiment is a resistor tree structure which acts as a voltage divider and generates the intermediate voltages. During testing of the write process, one of the several intermediate voltages is selected as a voltage $V_{IN}$ to be written to a selected memory cell. During testing of the read process, voltages $V_H$ and $V_L$, which are two of the intermediate voltages, are compared to an analog output signal generated by reading the selected memory cell. Typically, selected voltages $V_H$ and $V_L$ are equal to $V_{IN} \pm \Delta V$ where $\Delta V$ depends on a write/read resolution being tested. If the signal read out from the selected memory cell falls within the desired range, $V_{IN} \pm \Delta V$, a digital output test result signal represents a binary "1" indicating the write read process has met or exceeded the resolution being tested; otherwise, the output test result signal represents a binary "0" indicating the resolution has not been met.

Using digital control signals, an external tester can change voltages $V_H$ and $V_L$ so that $\Delta V$ incrementally decreases until test result signal indicates the signal read from the memory cell is outside the range $V_{IN} \pm \Delta V$ or incrementally increases until test result signal indicates the signal read from the memory cell is within the range $V_{IN} \pm \Delta V$. The value of $\Delta V$ when the value of the result signal changes indicates the resolution of the memory cell under test.

Since the test circuits are integrated on-chip, noise during testing can be minimized, and very high accuracy resolution testing can be achieved. Additionally, a low-cost digital tester can test all analog circuits associated directly with the writing and the reading of the analog memory devices.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, an analog integrated circuit (IC), i.e. an IC which manipulates analog input and/or output signals, contains on-chip test circuits for testing the analog functions of the analog IC. The on-chip test circuits implement analog functions internal to the analog IC but have only digital input and output signals. An external digital tester can control the on-chip test circuits by generating the required digital control signals and examining the digital result signals. Accordingly, expensive analog testers are not required for testing the analog IC during manufacture.

Pads used by digital test equipment to access the test circuits during manufacture can be made inaccessible to the user of the analog IC by not connecting the pads to output pins during packaging of the IC. In such embodiments of the invention, the addition of testing circuits does not increase the pin count of the analog IC. Alternatively, the test circuits can be user-accessible through separate pins for the test circuits or if low pin count is important, through multiplexed pins which connect to the test circuits when the chip is in a special test mode and connect to other circuits during normal chip functions. When the test circuits are user accessible, the user can test the analog IC in the application of the analog IC. User testing is particularly useful for non-volatile analog memory which, like conventional EPROM, EEPROM, and Flash memories, have write and read characteristics that may vary with the number of write/erase cycles performed throughout the memory's life.

In one embodiment of the invention, an on-chip test circuit includes a reference voltage generator and comparison logic. The reference voltage generator generates intermediate voltages at levels between digital "high" or "1" and "low" or "0" voltages. During testing, the intermediate voltages replace analog input signals required for testing the analog IC and/or provide references for the comparison logic. The comparison logic may, for example, include on-chip analog comparators which compare analog output signals to the internally generated intermediate voltages and produce a digital result signal.

Figure 1:
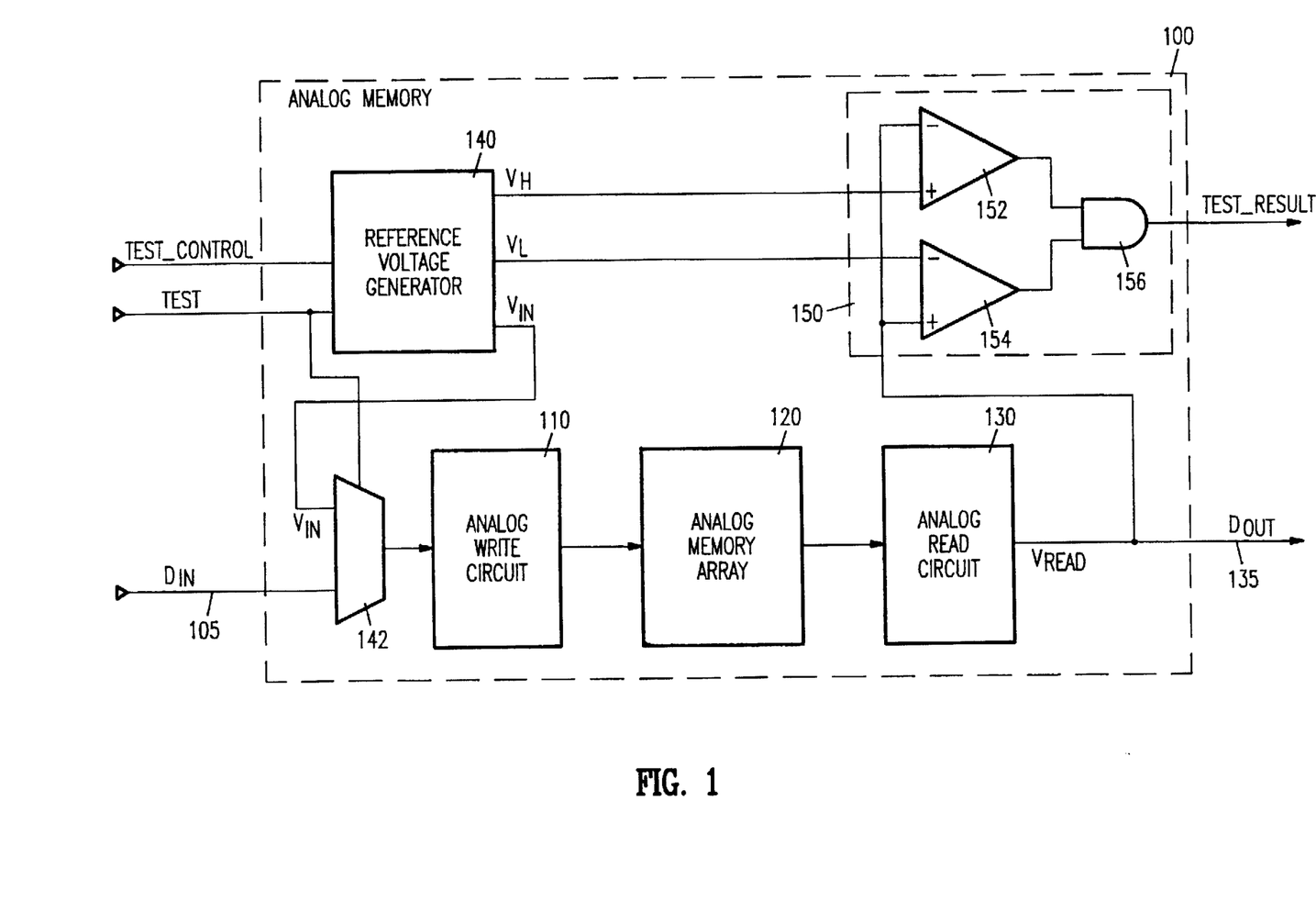
FIGS. 1 and 2 show block diagrams of analog memories containing test circuits in accordance with two embodiments of the invention.

FIG. 1 shows a block diagram of an integrated analog memory 100 which is a monolithic structure and may be fabricated using conventional semiconductor IC fabrication techniques. Analog memory IC 100 contains an analog write circuit 110, an analog memory array 120, and an analog read circuit 130 which may have any design capable of writing, storing, and reading analog values. U.S. patent application No. 08/333,381, entitled "High Resolution Analog Storage EPROM and Flash EPROM", which is hereby incorporated by reference herein in its entirety, describes suitable read circuits, write circuits, and memory cells for an embodiment of the invention where channel hot electron injection is used for writing analog values to non-volatile memory cells. Another embodiment of the invention employs EEPROM or Flash EEPROM and the Fowler-Nordheim tunneling (FNT) mechanism for writing analog values. Still other embodiments of the invention can employ other types of memory not restricted to non-volatile memory. For example, analog memory array 120 could be a volatile memory such as an analog DRAM array, where each memory cell contains a capacitor and an analog value is stored as a corresponding amount of charge in a memory cell's capacitor.

During a normal write to analog memory 100, an external source such as a microphone input (not shown) asserts an analog input signal $D_{IN}$ which passes through a multiplexer 142 to analog write circuit 110. The voltage level of signal $D_{IN}$ at a particular instant represents an analog sample or value to be written to a memory cell. Typically, digital address signals are required to select cells where values are written. The address signals may be generated internally (i.e. in analog memory 100) or externally (from outside analog memory 100). Analog write circuit 110 writes a value to a selected memory cell by changing a property such as the analog memory cell's threshold voltage to a state which indicates the value written. In such embodiments, the possible threshold voltages of an analog memory cell have a one-to-one relationship with the possible voltage levels of signal $D_{IN}$. The values written to analog memory array 120 remain stored as long as the analog memory cells' states are preserved.

Analog read circuit 130 reads the analog values stored in analog memory array 120. Reading generates an analog output signal $D_{OUT}$ having a voltage level which indicates an analog value read from analog memory array 120. For proper operation of analog memory IC 100, the value read from a memory cell should equal the value written to the memory cell. Typically, this requires that the voltage level of output data signal $D_{OUT}$ during reading of a value be approximately equal to the voltage level of input data signal $D_{IN}$ when the value was written to analog memory array 120. Some error or difference is permitted between values read and values written because exact reproduction of analog values cannot be easily achieved and is generally not required.

A range of acceptable differences between values written and values read is sometimes referred to herein as the resolution of analog memory 100 because values which differ from each other by more than the resolution can be resolved or distinguished from each other but values which differ by less than the resolution may be indistinguishable from each other after being stored. During manufacture, each analog memory IC is tested to determine its resolution. The analog memory IC can be graded according to resolution or if the resolution is very poor, discarded as defective.

To facilitate resolution determination, analog memory IC 100 contains test circuits which allow digital testing of analog functions without external analog test equipment or circuits. In particular, analog memory IC 100 contains a reference voltage generator 140 and comparison logic 150.

Reference voltage generator 140 generates voltages $V_{IN}$, $V_L$, and $V_H$ which have levels selected according to a digital control signal TEST_CONTROL. Comparison logic 150 generates a digital test result signal TEST_RESULT based on comparisons of analog output signal $D_{OUT}$ to voltages $V_L$ and $V_H$ from reference voltage generator 140.

Exemplary embodiments of reference voltage generator 140 which generate voltages $V_{IN}$, $V_L$, and $V_H$ at levels dictated by digital test control signal TEST_CONTROL are described below in regard to FIGS. 3, 4, and 5. During testing, an enable signal TEST is asserted to reference voltage generator 140 and multiplexer 142. Signal TEST is the select signal for multiplexer 142 and causes multiplexer 142 to pass voltage $V_{IN}$ from reference voltage generator 140 to analog write circuit 110. Analog write circuit 110 may contain an input amplifier which amplifies an input analog signal from an external source, for example, so that the maximum voltage of the input signal corresponds to the maximum value that can be written to analog memory array 120. Voltage $V_{IN}$ can either be input to the input amplifier or can bypass the input amplifier. When voltage $V_{IN}$ bypasses the input amplifier, additional testing of the input amplifier may be required. In either case, analog write circuit 110 writes a value represented by voltage $V_{IN}$ to a memory cell selected according to an address signal generated either internally or externally.

After writing the value represented by voltage $V_{IN}$ to analog memory array 120, testing proceeds with analog read circuit 130 reading the memory cell to which the value was written. Ideally, the value read is exactly equal to the value written, but a difference between the value written and the value read are acceptable if the difference is less than a resolution desired for analog memory 100. The acceptable differences between the value written and the value read prescribe a relationship between analog output signal $D_{OUT}$ and voltage $V_{IN}$. In a typical case, the relationship which identifies a value corresponding to an input voltage also identifies a value corresponding to an output voltage, and signal $D_{OUT}$ must be within a fixed voltage range of voltage $V_{IN}$ to meet the resolution requirements. In other cases, signal $D_{OUT}$ is proportional to voltage $V_{IN}$ or related to voltage $V_{IN}$ in some other fashion when the value read is exactly equal to the value written, and the acceptable voltage range for signal $D_{OUT}$ may not contain voltage $V_{IN}$.

Voltages $V_L$ and $V_H$ are the boundaries of the acceptable voltage range for analog output signal $D_{OUT}$. If read circuit 130 contains an output amplifier, signal $D_{OUT}$ can be taken from an input terminal or an output terminal of the output amplifier provided that voltages $V_L$ and $V_H$ are properly selected. Analog output signal $D_{OUT}$ and voltages $V_L$ and $V_H$ are input to comparison logic 150 which determines whether signal $D_{OUT}$ is between voltages $V_L$ and $V_H$. In the typical case, voltage $V_L$ is less than voltage $V_{IN}$ by an amount $\Delta V$, and voltage $V_H$ is greater than $V_{IN}$ by $\Delta V$, where $\Delta V$ depends on the resolution being tested. For example, if the range of analog signal $D_{OUT}$ is 5 volts and the desired resolution provides the equivalent of eight bits of information (256 levels), $\Delta V$ must be less than about 10 mV.

Comparison logic 150 includes analog comparators 152 and 154 and an AND gate 156. Analog comparator 152 or 154 may be a differential amplifier or op-amp which generates a digital "high" output voltage if the voltage applied to a positive input terminal of the amplifier is greater than the voltage applied to a negative input terminal of the amplifier and generates a digital "low" output voltage if the voltage applied to the positive input terminal is less than the voltage applied to the negative input terminal. Accordingly, the output voltage from analog comparator 154 is high if analog output signal $D_{OUT}$ is greater than voltage $V_L$, and the output voltage from analog comparator 152 is high if analog output signal $D_{OUT}$ is less than voltage $V_H$. AND gate 156 asserts signal TEST_RESULT high if analog signal $D_{OUT}$ is within the range greater than voltage $V_L$ but less than voltage $V_H$.

To measure the resolution of analog memory 100, a digital test can change digital control signals so that a gap between voltages $V_H$ and $V_L$ incrementally decreases until test result signal indicates the signal read from the memory cell is outside the range from $V_L$ to $V_H$ or incrementally increases until test result signal indicates the signal read from the memory cell is within the range from $V_L$ to $V_H$. The difference between $V_L$ and $V_H$ as indicated by the digital control signals when the value of the result signal changes indicates the resolution of the memory cell under test.

Testing can continue by allowing analog memory 100 to sit for a period of time then re-testing the memory cells to determine if any drift in the stored values has occurred. Alternatively or additionally, the memory cells which store data are re-tested after exposing analog memory 100 to high temperatures in a bake-in process and/or after applying stress voltages to the memory cells which store data. Accordingly, the testing simulates actual use of the analog memory.

After writing a value represented by a first voltage and testing a memory cell, a second value represented by a second voltage from reference voltage generator 140 can be written to the memory cell, and the resolution of the memory cell can then be tested in the vicinity of the second value. For a more complete testing of the memory cell, values near the bottom, middle, and top of the range which can be written to memory array 100 can be tested for resolution. If memory array 100 is a non-volatile memory, writing of each value can be preceded by an erase. Alternatively, it may be possible to write successive values without erasing if the values follow an order which successively increases the threshold voltage of a memory cell.

During the above described tests, an external tester only needs to supply digital signals such as signals TEST, TEST_CONTROL, and address signals and only needs to examine digital signals such as signal TEST_RESULT. Accordingly, an inexpensive digital tester can test the analog read and write processes of analog memory IC 100. Additionally, the test can be more accurate than those performed by analog testers because the analog signals (i.e. intermediate voltages) generated internally for testing of analog memory IC 100 are less susceptible to noise which may arise in leads of analog testers.

Figure 2:
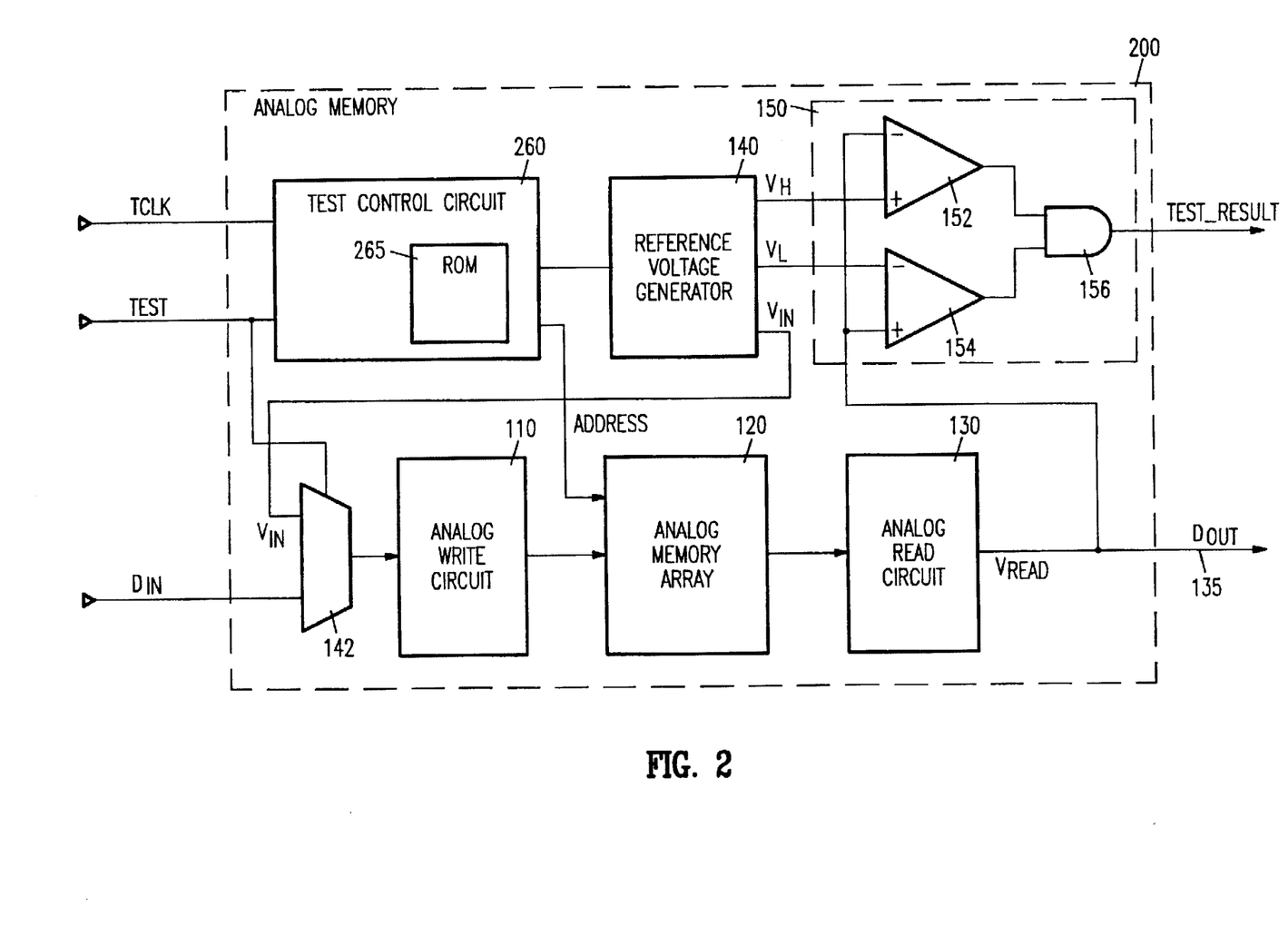

FIG. 2 shows an analog memory 200 in accordance with another embodiment of the invention. Analog memory 200 contains analog write circuit 110, analog memory array 120, analog read circuit 130, reference voltage generator 140, and comparison logic 150 such as described above in regard to FIG. 1. Analog memory 200 further includes a test control circuit 260 to reduce the number of external signals required for testing of analog memory 200. In particular, test control circuit 260, when activated by enable signal TEST, generates necessary test control signals to reference voltage generator 140 and/or address signals to analog memory array 120 as required to test the function of analog memory IC 200. Such signals may be from sequential addresses in a ROM 265. To test write and read functions of analog memory 200, an external tester asserts enable signal TEST and a clock signal TCLK to synchronize the sequence of address and control signals from test control circuit 260 with the tester. The tester then observes digital signal TEST_RESULT to determine whether the analog functions work as desired.

Figure 3:
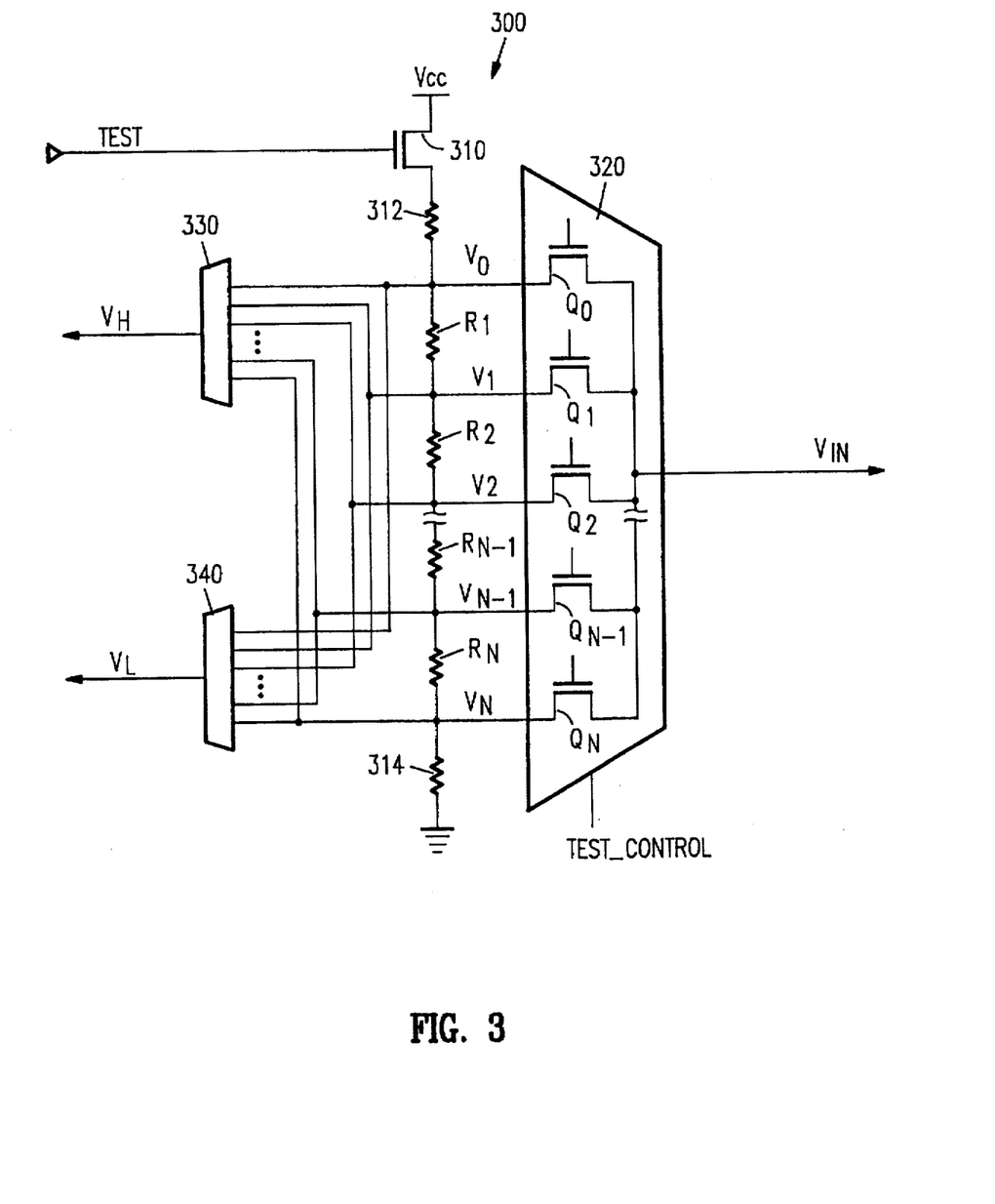
FIGS. 3, 4, and 5 are circuit diagrams of on-chip resistor tree structures which provide intermediate voltages for testing an analog memory in accordance with different embodiments of the invention.

FIG. 3 shows an embodiment of a resistor tree structure 300 usable as reference voltage generator 140 in analog memory 100 (FIG. 1) or 200 (FIG. 2). Resistor tree structure 300 includes a transistor 310 and a set of resistors $R_1$ to $R_N$ which are connected in series between a supply voltage Vcc and ground. Index N can be any desired integer. When enable signal TEST turns on a transistor 310, resistors $R_1$ to $R_N$ act as a voltage divider, and a series of intermediate voltages $V_0$ to $V_N$ develop at taps between resistors $R_1$ to $R_N$. Optionally, a resistor 312 and/or a resistor 314 can be added to the series of resistors to keep the highest intermediate voltage $V_0$ below supply voltage Vcc and/or the lowest intermediate voltage $V_N$ above ground potential. A multiplexer 320 selects one of voltages $V_0$ to $V_N$ as voltage $V_{IN}$. Similarly, multiplexers 330 and 340 select voltages $V_H$ and $V_L$, respectively.

In the embodiment of FIG. 3, multiplexer 320 is a collection of transistors $Q_0$ to $Q_N$ connected to taps in resistor tree structure 300, and control signal TEST_CONTROL is a multi-bit digital signal which turns on at most one of transistors $Q_0$ to $Q_N$ to select one of voltages $V_0$ to $V_N$. Alternatively, any multiplexer design may be employed for multiplexers 320, 330, and 340.

Figure 4:
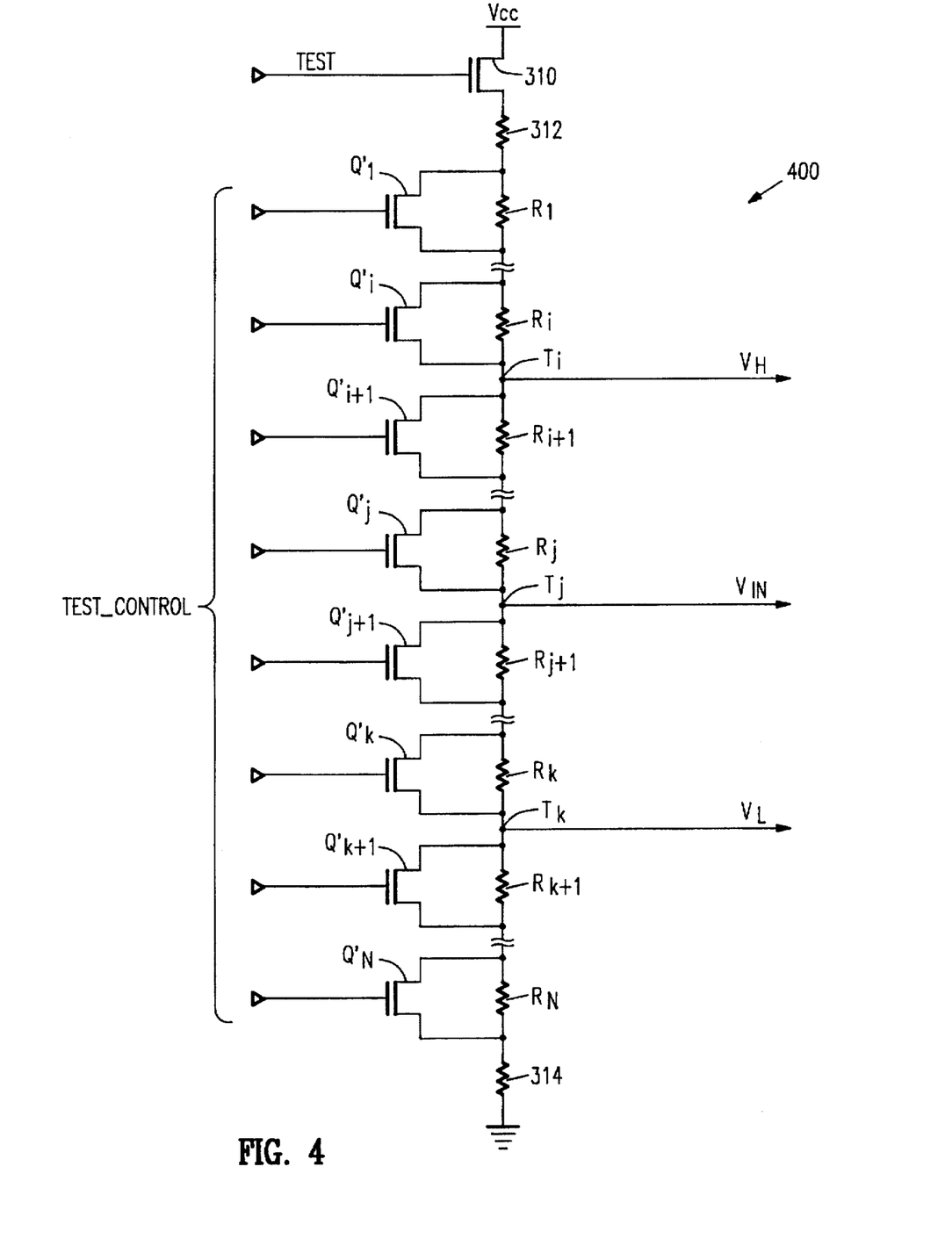

FIG. 4 shows another resistor tree structure 400 which is usable as reference voltage generator 140 in analog memory 100 or 200. Resistor tree structure 400 also contains a set of resistors $R_1$ to $R_N$ which are connected in series; but in tree structure 400, each resistor $R_1$ to $R_N$ is connected in parallel with a corresponding one of shunt transistors $Q_1'$ to $Q_N'$, and fixed taps $T_i$, $T_j$, and $T_k$ supply voltages $V_H$, $V_{IN}$ and $V_L$. Signal TEST_CONTROL selects levels for voltages $V_H$, $V_{IN}$ and $V_L$ by turning on a desired set of shunt transistors $Q_1'$ to $Q_N'$. Each shunt transistor turned on creates a short across an associated resistor which increases the voltage level at taps between the transistor and ground and decreases the voltage at taps between the transistor and supply voltage Vcc. Voltage $V_{IN}$ is determined by the ratio of the effective resistance between tap $T_j$ and supply voltage Vcc and the effective resistance between tap $T_j$ and ground. Similarly, voltages $V_H$ and $V_L$ have levels determined by effective resistance above and below their respective source taps $T_i$ and $T_k$.

In one embodiment of resistor tree structure 400, each of resistors $R_1$ to $R_N$ has the same resistance. In an alternative embodiment, resistors $R_1$ to $R_N$ have different resistances. For example, for each set of resistors such as $R_1$ to $R_i$, $R_{i+1}$ to $R_j$, $R_{j+1}$ to $R_k$, and $R_{k+1}$ to $R_N$, each resistor in the set can have twice the resistance of an adjacent resistor in the set. If the resistors in a set are related in this manner, the total resistance of the set is configurable in steps equal to the smallest resistance in the set. Alternatively, a nearly limitless number of other resistance combinations are possible.

Figure 5:
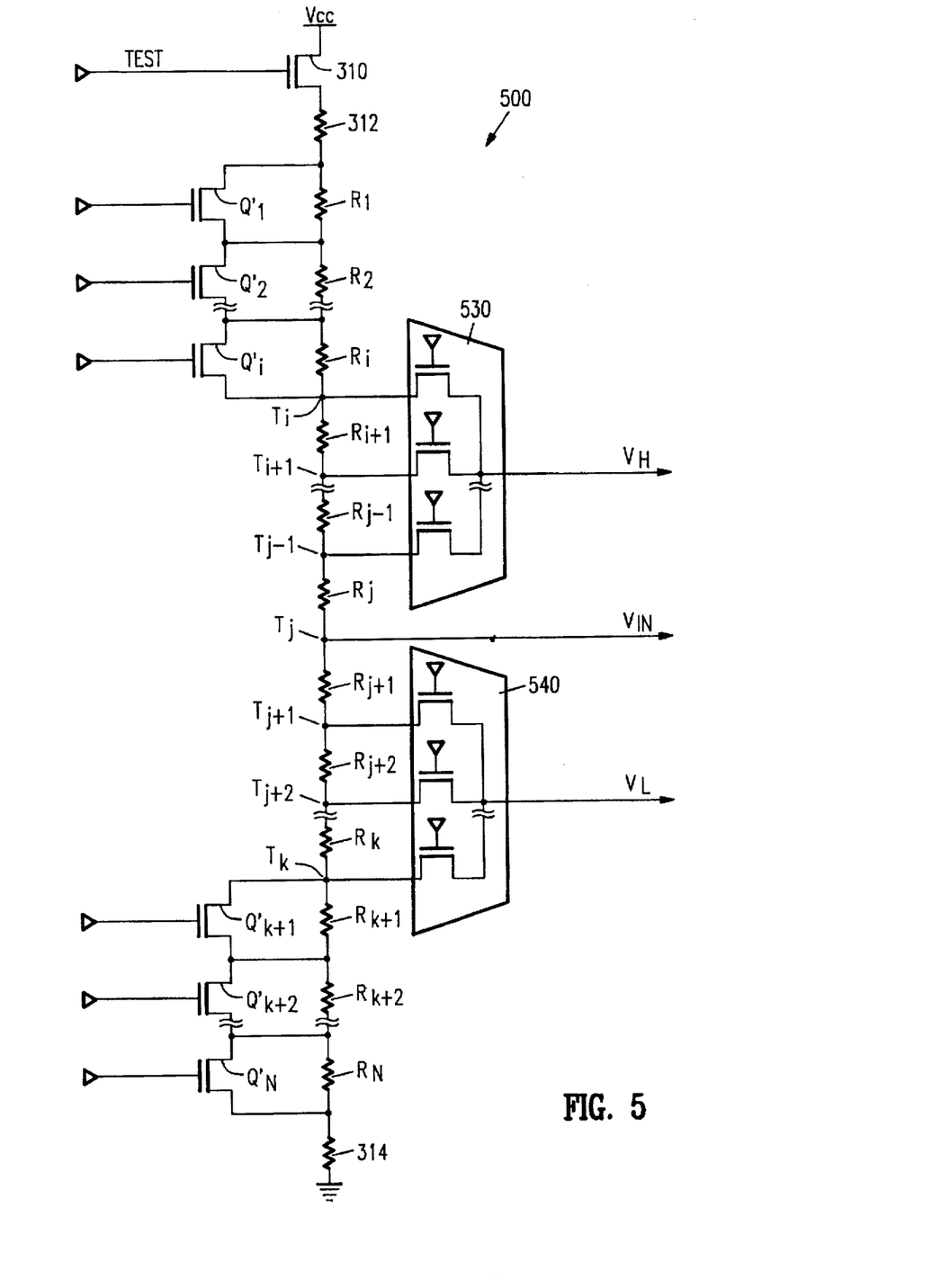

FIG. 5 shows yet another resistor tree structure 500 which is usable as reference voltage generator 140 in analog memory 100 or 200. In tree structure 500, transistor 310 and resistors $R_1$ to $R_N$ are connected in series between supply voltage Vcc and ground. A tap $T_j$, between resistors $R_j$ and $R_{j+1}$, is the source of voltage $V_{IN}$. Signal TEST_CONTROL sets or changes voltage $V_{IN}$ by turning on desired ones of shunt transistors $Q_1'$ to $Q_i'$ and $Q_{k+1}'$ to $Q_N'$ which effects voltage $V_{IN}$ in the same manner as shunt transistors in resistor tree 400 of FIG. 4.

Multiplexer 530 selects one of taps $T_i$ to $T_{j-1}$ as the source of voltage $V_H$. Since taps $T_i$ to $T_{j-1}$ are nearer supply voltage Vcc than is tap $T_j$, voltage $V_H$ is higher than voltage $V_{IN}$. Multiplexer 540 selects one of taps $T_{j+1}$ to $T_k$ as the source of voltage $V_L$. Since taps $T_{j+1}$ to $T_k$ are nearer ground than is tap $T_j$, voltage $V_L$ is lower than voltage $V_{IN}$. If resistors $R_{i+1}$ to $R_j$ are identical to resistors $R_{j+1}$ to $R_k$ and the same select signals are applied to multiplexer 530 and multiplexer 540, the absolute difference $\Delta V$ between voltage $V_{IN}$ and $V_H$ will be equal to the absolute difference $\Delta V$ between voltage $V_{IN}$ and $V_L$. Accordingly, for resistor tree 500, control signals to the shunt transistors $Q'_1$ to $Q'_i$ and $Q'_{k+1}$ to $Q'_N$ control the level of voltage $V_{IN}$, and control signals to multiplexers 530 and 540 select $\Delta V$ (the resolution being tested).

Resistor trees 300, 400, and 500 are only examples of reference voltage generators in accordance with the invention. Various modification are possible. For example, separate resistor trees can provide one or more of voltages $V_{IN}$, $V_H$, and $V_L$. Additionally, other circuits such as bandgap generators can generate required intermediate voltages, for example, when the absolute voltage levels are critical.

Although the invention has been described with reference to particular embodiments, the description is only an example of the invention's application and should not be taken as a limitation. For example, although a method for testing the resolution of an analog memory has been described, the same techniques can be used to test the accuracy of an analog output signal from any analog IC. Various other adaptations and combinations of features of the embodiments disclosed are within the scope of the present invention as defined by the following claims.

We claim:

1. An integrated circuit comprising:
   an array of analog memory cells;
   an analog write circuit coupled to the array;
   an analog read circuit coupled to the array;
   an analog comparator having a first input terminal and a second input terminal, the analog comparator generating an output signal having a digital state indicating whether a first input voltage is greater than a second input voltage level, a first input terminal of the analog comparator being connected to an output terminal of the read circuit when the read circuit reads a test value from the analog memory array; and
   a reference voltage generator coupled to provide a first voltage to the analog write circuit during writing of the test value and a second voltage to a second input terminal of the analog comparator during reading of the test value, wherein the first voltage represents the test value.

2. The integrated circuit of claim 1, wherein the first voltage and second voltage differ by an amount that depends on a desired resolution of the analog memory cells.

3. The integrated circuit of claim 1, further comprising a second analog comparator which generates an output signal having a digital state indicating whether a first input voltage is greater than a second input voltage, wherein during reading of the test value from the memory array, a third voltage from the reference voltage generator is applied to a first input terminal of the second analog comparator and the output signal from the read circuit is applied to a second input terminal of the second analog comparator.

4. The integrated circuit of claim 3, wherein the second voltage is greater than the first voltage, and the third voltage is less than the first voltage.

5. The integrated circuit of claim 1, wherein the reference voltage generator comprises a resistor tree structure.

6. The integrated circuit of claim 5, wherein the resistor tree structure comprises:
   a plurality of resistors connected in series, wherein a plurality of taps are between the resistors; and
   a first multiplexer having input terminals coupled to the plurality of taps.

7. The integrated circuit of claim 6, further comprising a second multiplexer having input terminals coupled to the plurality of taps, wherein the first multiplexer selects one of the taps to supply the first voltage and the second multiplexer selects one of the taps to supply the second voltage.

8. The integrated circuit of claim 5, wherein the resistor tree structure comprises:
   a plurality of resistors connected in series, wherein a plurality of taps are between the resistors; and
   a plurality of shunt transistors, each shunt transistor being connected in parallel with a corresponding one of the plurality of resistors.

9. The integrated circuit of claim 8, wherein one of the plurality of taps supplies the first voltage.

10. The integrated circuit of claim 9, further comprising a multiplexer coupled to a set of the taps, wherein the multiplexer selects one of the taps to supply the second voltage.

11. The integrated circuit of claim 1, further comprising packaging which makes the reference voltage generator and the analog comparator inaccessible to a user of the integrated circuit.

12. The integrated circuit of claim 1, further comprising packaging which makes the reference voltage generator and the analog comparator accessible to a user of the integrated circuit.

13. An integrated circuit comprising:
   an array of analog memory cells;
   means for writing in the array a value represented by an analog input signal;
   means for reading the array to generate an analog output signal representing a value read from the array; and
   digitally operable test circuitry comprising:
     means for using the writing means to write a test value to the array; and
     means for generating a digital output signal indicating whether the analog output signal from the reading means accurately represents the test value.

14. The integrated circuit of claim 13, wherein the digitally operable test circuitry further comprises:
   means for generating a first voltage and a second voltage, wherein the first voltage indicates to the writing means the test value for writing in the array; and
   means for generating a first signal having a digital state indicating whether the analog output signal has a voltage level grater than the second voltage.

15. The integrated circuit of claim 14, further comprising:
   means for generating a third voltage; and
   means for generating a second signal having a digital state indicating whether the analog output signal has a voltage level less than the third voltage.

16. The integrated circuit of claim 15, wherein the digital output signal has a digital state indicating whether the analog output signal has a voltage level greater than the second voltage and less than the third voltage.

17. A method for testing an analog memory, comprising the steps of:
   providing resistor tree structure incorporated on-chip with the analog memory;

writing to a selected memory cell in the analog memory a value represented by a first voltage from the resistor tree structure;

reading the selected memory cell to generate an analog output signal representing a value read from the selected memory cell;

comparing the analog output signal to a second voltage from the resistor tree structure; and generating a digital signal which indicates whether the analog output signal is at a voltage level greater than the second voltage.

18. The method of claim 17, wherein the second voltage differs from the first voltage by an amount that depends on a desired resolution for the analog memory.

19. The method of claim 17, further comprising:

comparing the analog output signal to a third voltage from the resistor tree structure; and generating a digital result signal which indicates whether the output signal is at a voltage level between the second and third voltages.

20. The method of claim 19, wherein a voltage difference between the second voltage and the first voltage is equal to a voltage difference between the third voltage and the first voltage.

21. The method of claim 19, further comprising:

varying the second and third voltage levels systematically until the digital result signal changes; and determining the resolution of the analog memory from the second and third voltages which causes the digital result signal to change.

22. The method of claim 19, further comprising:

writing to the selected memory cell a second value represented by a fourth voltage from the resistor tree structure;

reading the selected memory cell to generate a second analog output signal;

comparing the second analog output signal to a fifth voltage and a sixth voltage from the resistor tree structure; and generating a digital result signal which indicates whether the second analog output signal is at a voltage level between the fifth and sixth voltages.

23. The method of claim 17, wherein comparing the output signal to the second voltage comprises:

applying the output signal to a first input terminal of a first analog comparator which is incorporated on-chip with the analog memory; and applying the second voltage to a second input terminal of the first analog comparator, wherein the first analog comparator generates the digital signal which indicates whether the analog output signal is at a voltage level greater than the second voltage.

24. The method of claim 23, further comprising:

applying a third voltage from the resistor tree structure to a first input terminal of a second analog comparator which is incorporated on-chip with the analog memory;

applying the analog output signal to a second input terminal of the second analog comparator, wherein the second analog comparator generates a digital signal which indicates whether the analog output signal is at a voltage level less than the third voltage; and applying the digital signals from the first and second analog comparators to an AND gate to generate a digital result signal that indicates whether the analog output signal is greater than the second voltage and less than the third voltage.

25. An integrated circuit comprising:

analog circuitry which generates an analog output signal from an analog input signal;

a reference voltage generator coupled to the analog circuitry, the reference voltage generator generating a first intermediate voltage, a second intermediate voltage, and a third intermediate voltage, wherein during testing of the analog circuitry, the reference voltage generator provides to the analog circuitry the first intermediate voltage in place of the analog input signal;

a first analog comparator coupled to the analog circuitry and the reference voltage generator, wherein during testing of the analog circuitry, the first analog comparator generates a first digital signal indicating whether the analog output signal from the analog circuitry is greater than the second intermediate voltage;

a second analog comparator coupled to the analog circuitry and the reference voltage generator, wherein during testing of the analog circuitry, the second analog comparator generates a second digital signal indicating whether the analog output signal from the analog circuitry is less than the third intermediate voltage; and a gate coupled to generate a digital result signal which is a logical AND of the first and second digital signals.

* * * * *